United States Patent [19]

Dattilo

[11] Patent Number: 4,978,592
[45] Date of Patent: Dec. 18, 1990

[54] UNIVERSAL ELECTROLYTE LEVEL INDICATOR FOR WET CELL BATTERIES

[76] Inventor: Donald P. Dattilo, 2302 Taylorsville Rd., Louisville, Ky. 40205

[21] Appl. No.: 501,902

[22] Filed: Mar. 28, 1990

Related U.S. Application Data

[63] Continuation-in-part of Ser. No. 246,786, Sep. 20, 1988, Pat. No. 4,913,987.

[51] Int. Cl.⁵ .................... H01M 2/12; H01M 10/48
[52] U.S. Cl. ........................................ 429/89; 429/92
[58] Field of Search ............... 429/87, 90, 91, 92, 429/93; 340/620, 636, 521, 450; 324/432, 436, 437; 73/290 R, 304 R; 116/227

[56] References Cited

U.S. PATENT DOCUMENTS

| | | | |
|---|---|---|---|
| 3,319,597 | 5/1967 | Schnitzins et al. | 429/89 |
| 4,308,817 | 1/1982 | Peterson | 429/90 X |
| 4,562,127 | 12/1985 | Mangoue | 429/89 |

Primary Examiner—Anthony Skapars
Attorney, Agent, or Firm—Diller, Ramik & Wight

[57] ABSTRACT

A battery cap sensor probe including a generally hollow body having an interior chamber through which a conductive probe passes. The probe has a first end adapted for emersion into the electrolyte of a battery cell and a second end adapted for electrical connection to an electrical circuit. The second end is preferably a terminal portion crimped to the remaining portion of the conductive probe.

13 Claims, 6 Drawing Sheets

UNIVERSAL ELECTROLYTE LEVEL INDICATOR FOR WET CELL BATTERIES

BACKGROUND OF THE INVENTION

Cross-Reference to Related Application

This is a continuation-in-part application of U.S. application Ser. No. 07/246,786 filed Sept. 20, 1988, now U.S. Pat. No. 4,913,987 in the name of Donald P. Dattilo entitled universal Electrolyte Level Indicator for Wet Cell Batteries.

FIELD OF THE INVENTION

The present invention relates to novel improvements in A battery monitors by which an individual cell in a wet cell battery may be monitored for variations in the level of electrolyte contained in the cell. More specifically, the invention relates to a universal electrolyte level indicator which may be attached to, and made part of, battery powered mobile equipment of all types for the purposes of providing a warning indication to the operator of the equipment that water needs to be added to the batteries contained therein.

DESCRIPTION OF THE PRIOR ART

The prior art is replete with systems that indicate the electrolyte level within one or more cells of a wet cell battery. For example, U.S. Pat. Nos. 3,996,579; 3,891,465; 3,366,943; 2,779,015; 2,534,633 and 2,471,660 all describe systems for indicating battery electrolyte level drops using probes which are inserted into one or more cells and when the level of the fluid drops below a minimum acceptable level a circuit is completed which activates some type of warning device.

The prior art is likewise replete with devices that monitor state of charge (specific gravity) and/or temperature within a battery in addition to electrolyte level, as described in U.S. Pat. Nos. 4,625,201; 4,388,584; 4,329,406 and 4,247,188. The prior art also discloses the use of special materials to enhance the operational characteristics of the probes. German Pat. No. 2,454,410 explains the use of tungsten carbide electrode accumulators, while British Pat. No. 709,419 defines the use of platinum probes.

The prior art does not reveal an electrolyte level sensing device that may be used universally on batteries ranging from 6 vdc to 48 vdc without any modifications in circuit components or adjustments of any type whatsoever. Furthermore, the prior art has not addressed the special requirements associated with battery powered mobile equipment, such as the capability to monitor the level of electrolyte in a cell that is not electrochemically located between the positive and negative terminals of the battery used as the power source for the monitoring device. Additionally, no prior art was found that incorporates the use of double oscillators operating at different frequencies to produce a constant brightness of the indicating LED over a wide range of power source voltages in the context of the present invention as more fully described below.

Thus, notwithstanding the relatively substantial prior art in this particular field of technology, it is believed that the prior art neither teaches nor renders obvious the unique construction and universal operation of the electrolyte level indicator of the present invention.

SUMMARY OF THE INVENTION

The present invention is directed to an electrolyte level indicator, for use on wet cell batteries, that may be universally applied to any battery or group of batteries with a total voltage of 6 vdc to 48 vdc to monitor the electrolyte level in a single cell. The monitor includes a battery cap sensor probe that is inserted into a single cell of a wet cell battery and electrically connected, through a single wire, to a panel mounted transducer that indicates, by means of a flashing LED, that the electrolyte is below an acceptable level thereby producing a general indication that all the cells in the battery/batteries should be filled with water.

Detailed Description of the Invention and Drawings

It is well recognized that the level of electrolyte in wet cell batteries must cover the internal battery plates to maintain correct operation. When a battery is recharged, a certain amount of the electrolyte will evaporate as the battery reaches the gassing voltage, normally 2.37 volts per cell; thereafter the rate of evaporation will continue to increase until the battery reaches 2.52 volts per cell (full charge) and the charge cycle is terminated. If the level of electrolyte has not dropped below the top edge of the internal battery plates after the charging cycle is completed, the battery may be used at full rated capacity; however, if the level of electrolyte has dropped below the top edge of the plates and the battery is put in service, permanent internal damage and reduced capacity will result. For this reason, it is desirable to develop a system to monitor the level of electrolyte on a continuous basis that is more reliable than the conventional method of visual inspection and more universally usable than is allowed by existing electronic methods.

Equipment powered by wet cell batteries that are not normally removed from the equipment to be recharged are very susceptible to damage caused by a drop in the level of electrolyte because the operators don't normally check the level when they recharge the batteries. Some examples of this type of equipment are electric floor sweepers, golf carts, personnel carriers, etc. It is not uncommon for such equipment to be rendered inoperative because no means of warning was available to indicate that water should be added to the battery/batteries. The present invention was, thus, developed to provide a reliable, low cost warning device that could be permanently attached to, and universally operated on, several different types of mobile equipment regardless of the operating voltage.

Figure 1A:
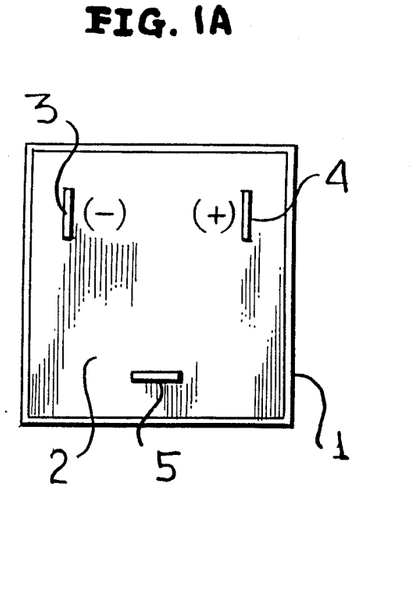
FIGS. 1A, 1B and 1C show the rear, side and front views respectively of the transducer in the preferred embodiment of the present invention.

Referring now specifically to the drawings, FIG. 1A shows a rear view of the transducer 1 in its fully assembled form. Transducer I is one part of a two part system that comprises the complete electrolyte level indicator. In its preferred embodiment, the enclosure for transducer 1 is a plastic potting shell measuring 1Ⓡ"×1Ⓡ"×Ⓡ" with an opening in the rear as shown. Protruding from the rear of transducer 1 are three spade type connectors 3, 4 and 5 which are internally connected to electronic circuits. During the assembly process an epoxy compound 2 is poured into the potting shell and, when fully cured, becomes part of transducer 1. The use of epoxy compound 2 provides a means of completely sealing the internal circuits of transducer 1.

Figure 1B:
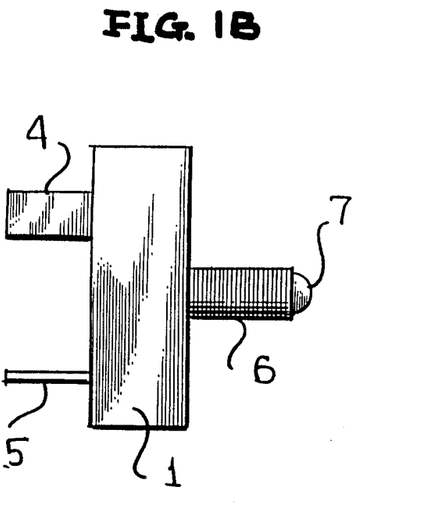

FIG. 1B shows a side view of transducer 1 depicting a hollow metal bushing 6 which is threaded on its external surface. The bushing 6 extends forward through a centrally located hole in the potting shell of the transducer 1. Terminals 3, 4 and 5 extend rearward from transducer 1 to form electrical connectors. (The rearward extension of terminal 3 is not evident in the side view illustration.)

Figure 1C:
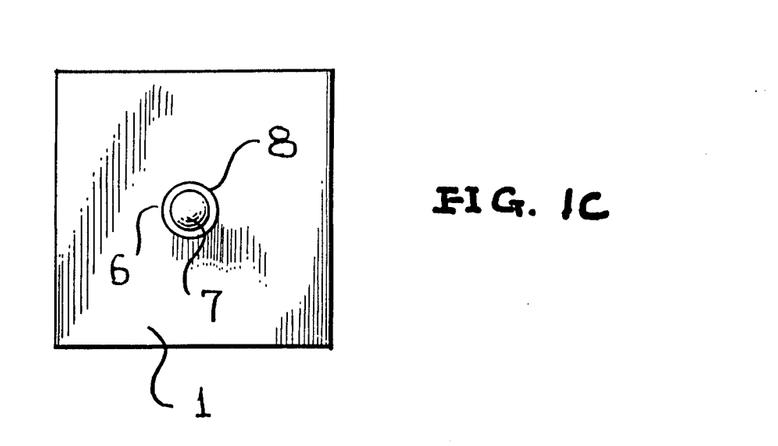

FIG. 1C shows a front view of transducer 1. Located inside bushing 6 is LED 7 which is connected to internal circuits. The top portion of metal bushing 6 contains an inward 45° bevel 8 that acts as a reflector for LED 7 when it is illuminated in much the same manner as the reflector of a normal flashlight. This method of construction allows transducer 1 to be mounted through a single hole in an instrument panel and held secure by tightening a nut with threads that match the threads on the external surface of bushing 6. As a result, bushing 6 serves the dual purpose of providing a means of mounting transducer 1 and a reflective means of increasing the viewing angle of LED 7.

Figure 2:
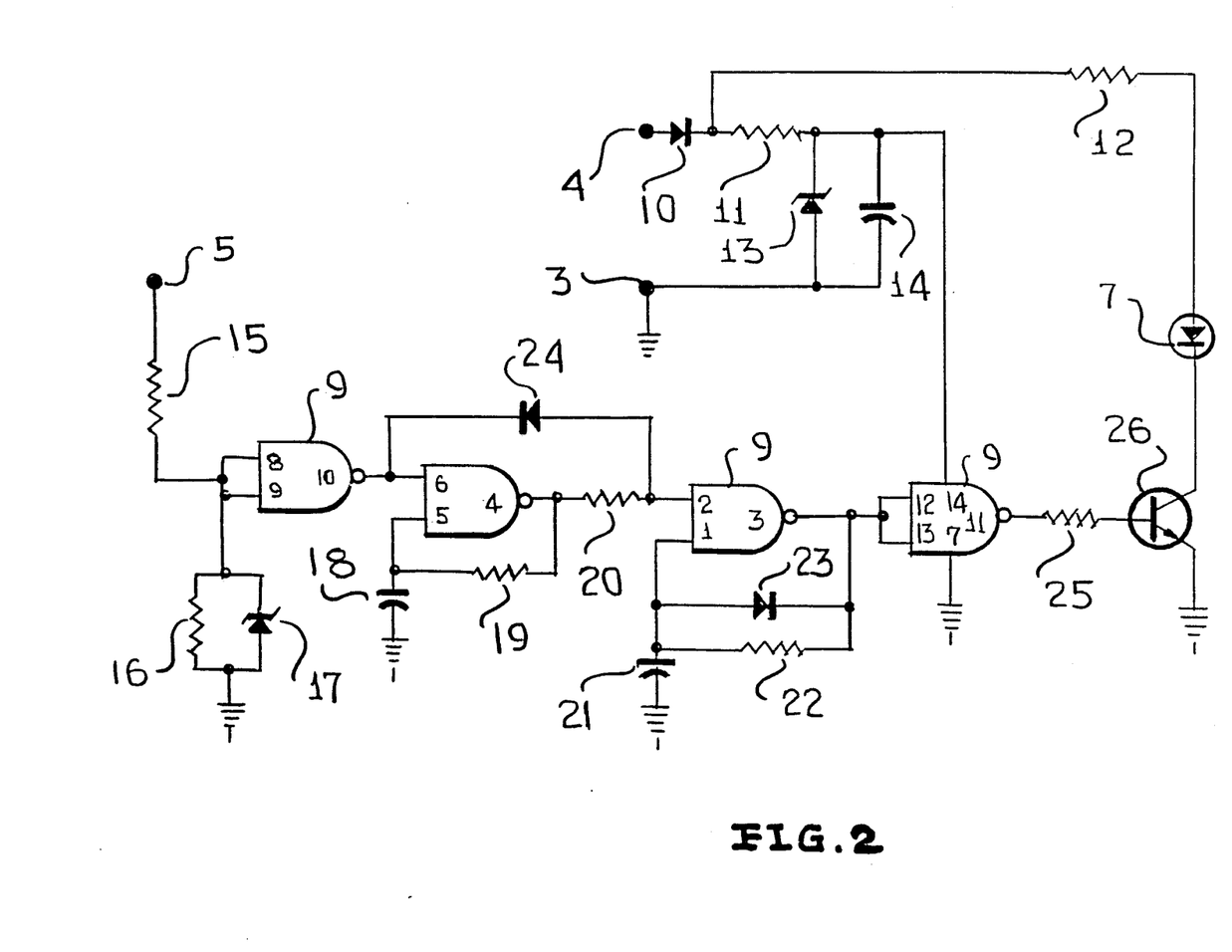
FIG. 2 shows a schematic diagram of the preferred circuitry of the present invention.

FIG. 2 is a schematic diagram of the preferred embodiment of the circuitry inside transducer 1 The circuit uses a CMOS Quad 2-input NAND gate such as a CD4093; each of the four gates 9 are shown individually with pin numbers assigned to the appropriate input and output pins. Terminal 3 is connected to the negative battery terminal thus serving as the negative side of the power supply for the circuit of FIG. 2. If more than one battery is used, for example, when a group of batteries are connected in series to obtain a higher total voltage, terminal 3 is connected to the most negative battery terminal of the serially connected combination of batteries. Terminal 4 is connected to the positive battery terminal when a single battery is used, such as a single 6 v or 12 v battery, or any positive battery terminal in a serially connected combination of batteries if more than one battery is to be used. The maximum input voltage to terminal 4 from a D.C. power source is 65 vdc which will accommodate a 48 v battery that is being recharged. In order to make the detector system capable of operating at various battery voltages from 6 vdc to 48 vdc it is necessary to include the increase in battery voltages that will occur when the battery is recharged. When a 48 v battery or a serially connected group of batteries with a total rated voltage of 48 volts is recharged, the actual applied voltage from the battery charger will be 60.48 volts (48 v battery combination is comprised of 24 cells, times a full charge voltage of 2.52 volts per cell=60.48 volts). Terminal 4 accepts the positive voltage required to operate the circuit of FIG. 2.

The anode side of rectifier 10 is connected to terminal 4 and the cathode side of the rectifier 10 is connected to one end of resistor 11. The other end of resistor 11 is connected to the cathode of a 10 v zener diode 13 and the positive side of filter capacitor 14 and to the positive supply pin 14 of integrated circuit 9 (hereinafter referred to as IC-9). The anode side of zener diode 13 and the negative side of capacitor 14 are connected to a circuit ground point which is electrically the same as terminal 3. The circuit comprised of rectifier 10, resistor 11, zener diode 13 and capacitor 114 provides a voltage limited source of power to IC-9. The voltage applied to pin 14 or IC-9 will increase or decrease in proportion to the input voltage applied to terminal 4; however, the maximum voltage that is allowed to pass through to pin 14 of IC-9 will be limited to 10 vdc. This power supply circuit is used instead of a conventional 3-pin voltage regulator to allow enough current to be passed to IC-9 to maintain correct circuit operation at the low voltage limit of 6 vdc. Using conventional voltage regulators would not allow this to occur. With 6 vdc applied to terminal 4, the supply voltage presented to pin 14 of IC-9 will be 4.5 vdc. When the maximum input voltage of 60.48 v (48 v battery being recharged) is applied to terminal 4, the supply voltage to IC-9 will be limited to 10 vdc, thereby adhering to the operating limitations of IC-9 which are no less than 3 vdc or no more than 18 vdc.

The probe input terminal 5 is serially connected through resistor 15 to input pins 8 and 9 cf IC-9. The input pins 8 and 9 are also serially connected to a parallel circuit comprised of resistor 16 and 10 v zener diode 17 to ground. This circuit limits the input voltage applied to pins 8 and 9 of IC-9 to a maximum of 10 volts thereby allowing the probe input terminal 5 to convert much higher voltages obtained at individual battery cells to low lever logic voltages that will activate inputs 8 and 9 of IC-9 without causing damage. Since IC-9 is a CMOS integrated chip and, thus, capable of operating at very low currents; the input current passing through terminal 5 never exceeds 2 ma (2/1,000-amp), thus eliminating any possibility of arcing inside a battery cell when terminal 5 is connected to an appropriate sensor. During operation, terminal 5 will be at some positive voltage level with respect to ground (most negative battery terminal) determined by the location of the cell being monitored. This occurs due to the ability of the electrolyte in a wet cell to produce a voltage equal to its relative proximity to the most negative terminal of the battery/batteries. When an appropriate sensor is in contact with the electrolyte in a battery, a resistor divider network comprised of resistors 15 and 16 presents the positive voltage to input pins 8 and 9 of IC-9 which causes the output pin 10 of IC-9 to remain at ground potential (low).

Figure 3A:
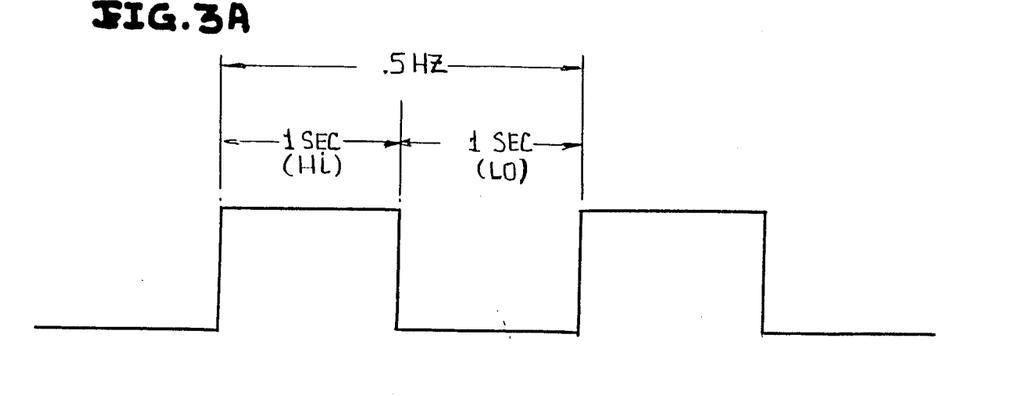
FIGS. 3A, 3B and 3C show waveform representations that will illustrate the operation of the circuits in FIG. 2.

When the level of the electrolyte drops below a predetermined point, established by an appropriate sensor, the positive voltage going to terminal 5 is removed which allows resistor 16 to pull inputs 8 and 9 of IC-9 low causing output pin 10 to go high, thus providing a means of turning the circuit on and off, and eliminating the need for any type of reset button. Output pin 10 of IC-9 is connected to the input pin 6 of the next gate of IC-9. Pin 5 of IC-9 is connected through capacitor 18 to ground and also through resistor 19 to output pin 4 of the same gate of IC-9. This circuit combination will cause output pin 4 to oscillate at a predetermined frequency when input pin 6 is high. If input pin 6 of IC-9 goes low and remains low, pin 4 will go high and remain high, thus stopping the oscillation. Component values ar selected for capacitor 18 and resistor 19 to produce a 50% duty cycle oscillator running at a frequency of 0.5 HZ (1-sec high, 1-sec low). The output frequency at pin 4 of IC-9 during oscillation is shown graphically in FIG. 3A.

Figure 3B:
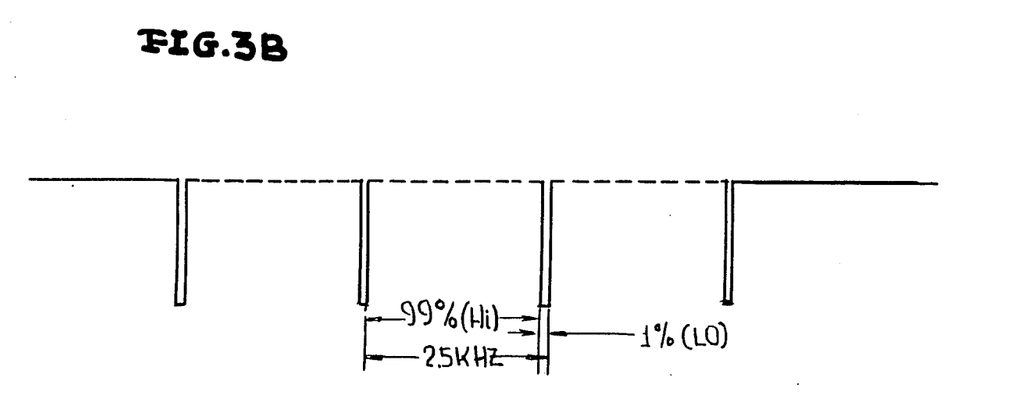

Resistor 20 is serially connected between the output pin 4 of IC-9 to the input pin 2 of the next gate of IC-9. Pin 1 of IC-9 is connected through capacitor 21 to ground and also through resistor 22 to output pin 3 of the same gate of IC-9. Connected parallel across resistor 22 is diode 23 with the anode connected to pin 1 of IC-9, thereby producing a second oscillator with a very short off (low) time. The output pin 3 of this second oscillator will oscillate when pin 2 of IC-9 is high. Component values are selected for capacitor 21 and resistor 22 to produce a 2.5-KHZ output frequency. Diode 23 provides a very low resistance discharge path for capacitor 21 which reduces the low portion of the duty cycle of the second oscillator to 1%. The output frequency at pin 3 of IC-9 is shown graphically in FIG. 3B to illustrate the ratio of the duty cycles.

Figure 3C:
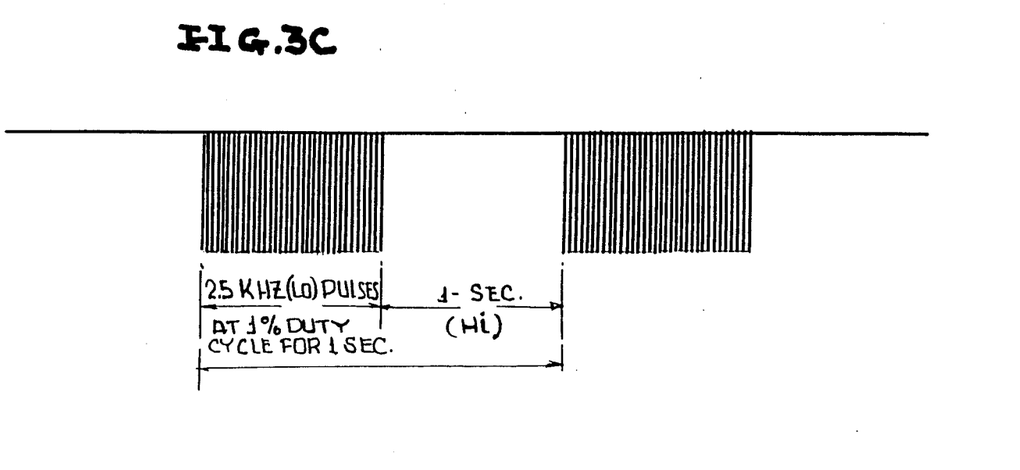

When pin 6 of IC-9 receives a high signal which activates the circuit; the output of the first oscillator (pin 4 of IC-9) is used to energize input pin 2 of the second oscillator through serially connected resistor 20. The connection of the output of the first oscillator to the input cf the second oscillator produces a burst of 1% duty cycle pulses, at a 2.5-KHZ rate, at the output of the second oscillator pin 3 of IC-9. The burst of pulses occur at regular intervals one second apart as shown graphically in FIG. 3C. Diode 24 is connected between pin 6 and pin 2 of IC-9 with the anode connected to pin 2 to cause both oscillators to turn off when the pin 6 of IC-9 goes low. In each case the off condition of the oscillators will cause the respective outputs to go to and remain at a high state.

The output of the second oscillator at pin 3 of IC-9 is connected to pins 12 and 13 of the next gate of IC-9 which functions as an inverter. When input pins 12 and 13 are high, output pin 11 is low and vice-versa. Pin 11 is serially connected through resistor 25 to the base of a NPN transistor 26 which may also be a FET (Field Effect Transistor) or any other type of solid state switching device. The emitter lead of transistor 26 is connected to ground while the collector lead of transistor 26 is connected to the cathode of LED 7. The anode of LED 7 is serially connected through resistor 12 to the cathode side of rectifier 10. Other types of signalling devices such as lamps, buzzers, audio transducers, etc., may be used in place of LED 7 without affecting circuit operation. When the circuit is activated, the base of transistor 26 receives pulses generated by the foregoing oscillators and turns on and off accordingly. Transistor 26 thus provides a ground return path for current flow through resistor 12 and LED 7. The source of power used to energize the LED is taken from the input voltage present at terminal 4, through rectifier 10 which would normally be much too high a voltage to apply directly to LED 7 without causing damage; however, because the voltage is switched through LED 7 at a 2.5-KHZ rate, with a 1% duty cycle, LED 7 emits a higher than normal brightness without being damaged. The high frequency/low duty cycle method of applying power to LED 7 also provides a means of obtaining a relatively constant brightness through the entire operating range of 6 vdc to 48 vdc. As a result of the burst of 2.5-KHZ pulses for a duration of one second followed by the absence of any pulses for one second; LED 7 appears to flash on and off at one second intervals when the circuit of FIG. 2 is activated. Resistor 12 may be included in the circuit serially connected between rectifier 10 and LED 7 to limit the brightness of LED 7 if desired., however, the circuit will operate correctly if LED 7 is connected directly to rectifier 10 without resistor 12 to limit the current.

It should be noted that other types of integrated circuits such as counters, timers or special function chips may be used to duplicate the circuit operation as described above., however, IC-9 was selected as the most cost effective integrated circuit to provide the desired results.

Figure 4:
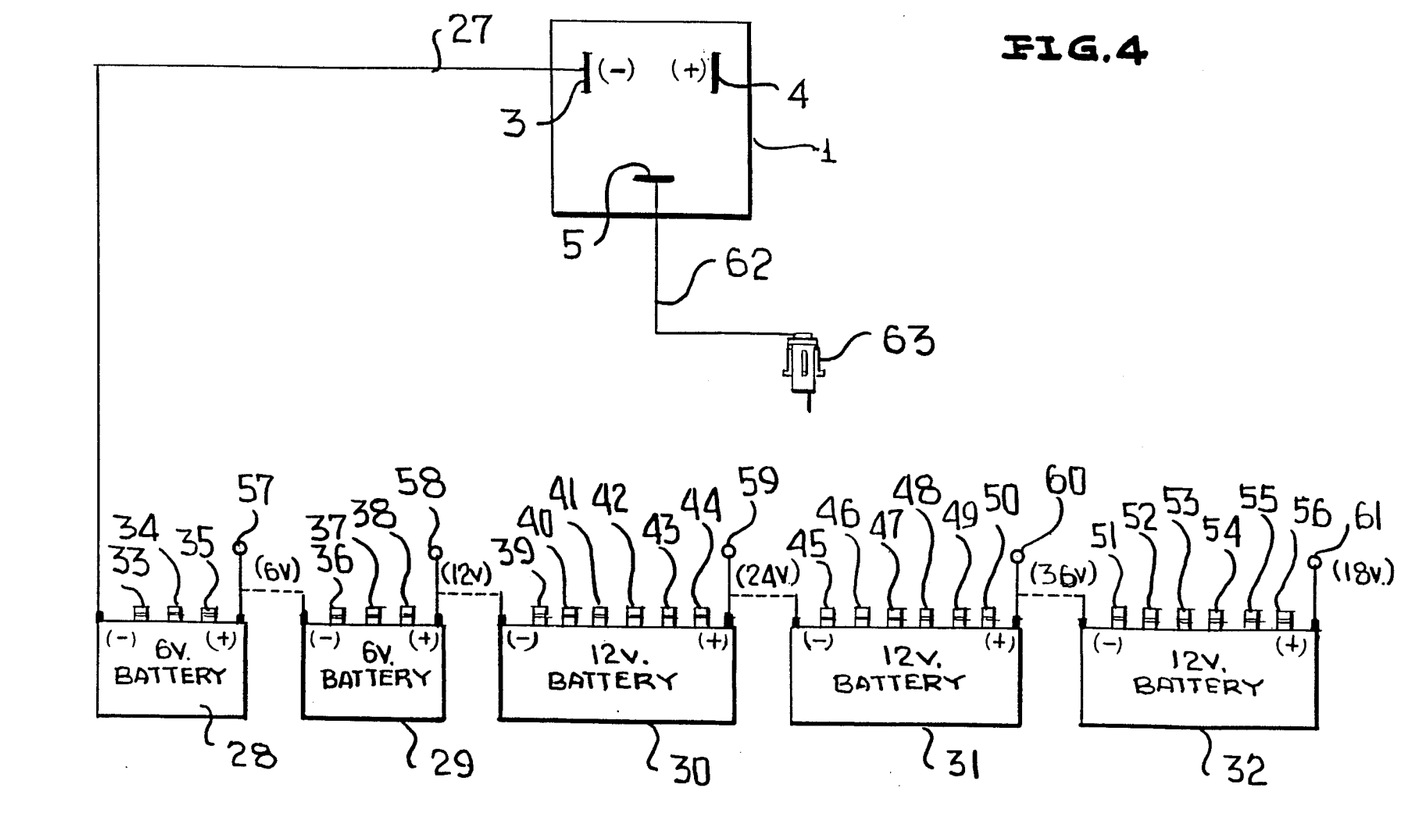
FIG. 4 shows the various methods of interconnection for standard and non-standard applications of the present invention.

FIG. 4 shows a pictorial illustration of the possible interconnections of the present invention to a single battery or a group of batteries connected in series for the purpose of obtaining a higher voltage as a source of power to operate various types of mobile equipment. FIG. 4 shows the negative connector 3 of transducer 1 connected to the negative battery terminal of battery 28 through wire 27. If only a single 6 v battery were being used as the source of power for the mobile equipment, it would likewise be the only source of power for the present invention and would, therefore, require that the positive connector 4 of transducer 1 be connected to the positive battery terminal 57 of the 6 v battery 28. The battery cap sensor probe 63 would be electrically connected to connector 5 of transducer 1 through wire 62 and physically inserted into one of the cells in battery 28. In order to insert sensor probe 63 into one of the cells of battery 28, one of the conventional battery caps 33, 34 or 35 in battery 28 would have to be removed and discarded to allow for the installation of sensor probe 63. When the present invention is used in an application where a single 6 v battery is the total source of power, as defined above, the location of the cell selected for insertion of sensor probe 63 is of prime importance. The circuit of FIG. 2 allows transducer 1 to operate over a wide range of voltages, however, the internal circuit voltage of transducer 1 is only 4.5 volts when powered from a 6 v battery. The circuitry cf transducer 1 requires that the voltage applied to connector 5 of transducer 1 be at least one half (2.25 volts) of the internal circuit voltage to operate correctly. The reason for this requirement is based upon the transfer characteristics of IC-9 in the circuit of FIG. 2; which requires that the voltage applied to any input of IC-9 must be at least one half of the voltage used to supply power to IC-9 to cause the corresponding output to change state.

As a result, the cell selected in battery 28 for insertion of sensor probe 63 must be capable of producing a voltage of at least 2.25 volts. Since individual cells in a wet cell battery generally produce 2 volts per cell, it would be necessary to insert sensor probe 63 in place of battery cap 34 (the second cell from the most negative battery terminal) in battery 28 to obtain a voltage high enough to activate the circuits of transducer 1; or sensor probe 63 could be inserted in place of battery cap 35 (the third cell) and still operate correctly. If we now serially connect the two 6 v batteries 28 and 29 together to produce a 12 v battery source and connect the positive connector 4 of transducer 1 to the positive battery terminal 58 of battery 29, the innerconnections will be complete for operation at 12 volts. When transducer 1 is powered from a 12 v source, the internal circuits of FIG. 2 will be operating from an internally derived source of 8.5 volts which means that connector 5 of transducer 1 must receive a voltage of at least 4.25 volts (one half the internal voltage of FIG. 2) to operate correctly. It would now be necessary to insert the sensor probe 63 in place of battery cap 35 (the third cell) to obtain a voltage high enough to activate the circuits in transducer 1. Since two 6 v batteries connected in series are an exact equivalent to one 12 v battery, both containing 6 cells, the above configuration would directly apply to operation from a single 12 v battery. If we now serially connect the 6 v batteries 28 and 29 and the 12 v batteries 30 and 31 to produce a total battery voltage of 36 volts and connect the positive connector 4 of transducer 1 to the positive battery terminal 60 of battery 31, the interconnections will be complete for operation at 36 volts. When the transducer 1 is powered from a 36 v source, the internal circuits of FIG. 2 will be operating from an internally derived source of 10 volts which means that connector 5 of transducer 1 must receive a voltage of at least 5 volts to operate correctly; however, it is evident that the required sensing voltage is available without moving the location of sensor probe 63. Thus, it is possible to operate the present invention universally on batteries ranging in voltage from 6 v to 48 v by inserting sensor probe 63 into a single cell located three cells from the most negative battery terminal. Since the circuits of FIG. 2 convert the voltage applied to connector 5 to low level logic signals, it is possible to insert the sensor probe in any cell producing a voltage up to 65 vdc, thus making it possible to locate sensor probe 63 in any cell (in the place of battery cap 35 up to battery cap 56) and still obtain correct operation.

A unique feature of the present invention is the capability to monitor a cell that is not electro-chemically located between the positive and negative terminals of the battery source used to supply power to the monitoring device. This can be shown by example if the serial innerconnections are retained for 36 v operation, but the sensor probe is relocated in place of battery cap 56 of battery 32. In this location sensor probe 63 will be monitoring a voltage of 48 volts which is within an acceptable range for the circuits of transducer 1, yet well above the operating voltage of transducer 1. In an extreme case the same would hold true if the operating voltage was 6 vdc and the monitored voltage was 48 vdc, thus rendering the present invention truly universal. The need to monitor a cell producing a voltage that is higher than the system operating voltage is often required in mobile equipment that obtains different voltages for operating various devices such as motors, compressors, etc. by tapping a serially connected group of batteries at various battery terminals.

Figure 5:
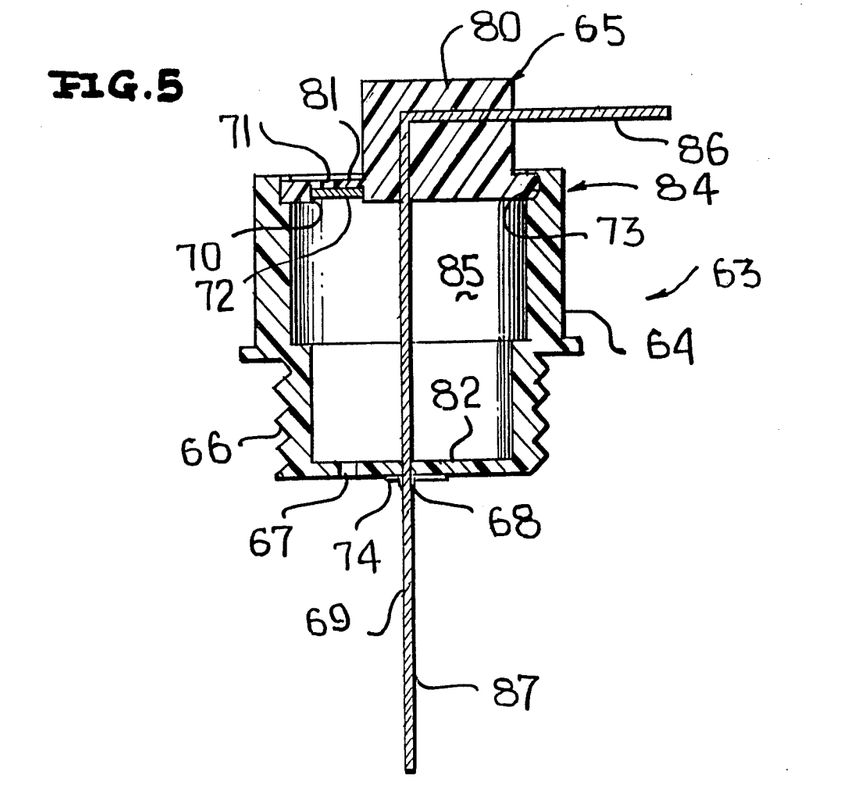
FIG. 5 is a cross-sectional view of a first embodiment of the battery cap sensor probe of the present invention.
Figure 6:
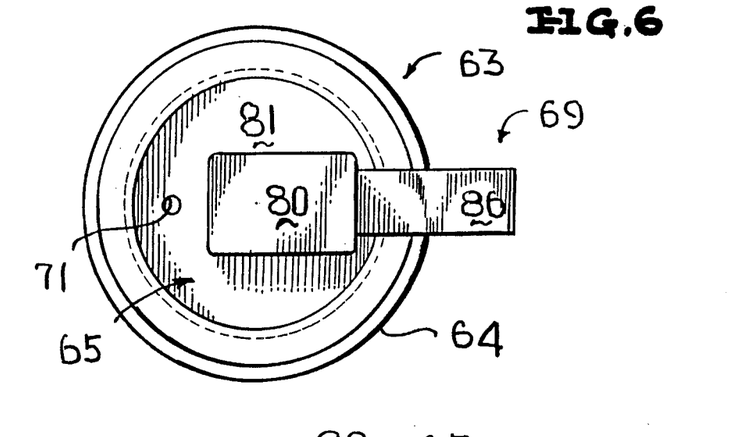
FIG. 6 is a top view of the battery cap sensor probe of FIG. 5.

FIG. 5 shows a cross-sectional view of a first embodiment of the battery cap sensor probe 63 comprised of a base 64 with a "snap-fit" cap insert 65. Base 64 and insert 65 are each a onepiece molding made from a non-corrosive material such a polypropylene that will not be affected by direct contact with the acid solution contained within a wet cell battery. Base 64 and insert 65 define a generally hollow body 84 having an interior chamber 85. In this particular embodiment the base 64 is a hollow tubular structure with threads 66 formed in the lower portion as depicted in FIG. 5 to allow the sensor probe 63 to be screwed into a single cell of a wet cell battery with matching threads. The threads 66 may be of various sizes to accommodate different thread sizes in various batteries. In a like manner the lower portion of base 64 may be molded to accommodate either a push-in or bayonet type receptacle in various types of batteries. The bottom surface of base 64 contains a ⅜" vent hold 67 to allow gases that are created inside a wet cell to pass through. Centrally located in the bottom surface of base 64 is slot 68 measuring 0.250"×0.035" to allow the lower extension of probe plate 69 to pass through the bottom surface of base 64. The top of cap insert 65 contains a raised section 80 (as shown in FIG. 6) to provide for the integral molding of probe plate 69 into cap insert 65. The cap insert 05 is disc-shaped with the 90° angular portion (unnumbered) of probe plate 69 molded therein forming a single structure, as shown in FIG. 5. Located in the bottom surface of cap insert 65 is a counterbore 70 that provides a circular depression in the bottom surface of cap insert 65. Centrally located in the counterbore 70 is a through hole 71 providing an opening to the top surface of cap insert 65. Pressed into counterbore 70 is porous disc 72 which acts as a flame arrester, thus allowing gases escaping from the wet cell to flow through vent hole 67 in the bottom wall 82 of the base 64 up through the interior chamber, through disc 72 and out through hole 71 in the flat portion 81 of cap insert 65. The use of disc 72 prevents an open flame from entering into sensor probe 63, yet allows internal gases to escape.

Located around the internal circumference of the upper portion of base 64 is an inwardly opening peripheral groove 73 extending into the inside wall of base 64. The outer peripheral edge of the flat portion 81 of cap insert 65 is molded to a tolerance relative to counterbore 73 to allow cap inset 65 to "snap-fit" into counterbore 73. The bottom edge of the flat portion 81 of cap insert 65 contains in inward 45° bevel to provide a means of introducing cap insert 65 into counterbore 73 prior to applying enough pressure to cause cap insert 65 to "snap-fit" into counterbore 73. A spring-type retainer clip (torsion spring 74) is inserted upon the probe plate 69 adjacent to bottom wall 82 of the base 64 which prevents the cap insert 65 from separating from the base 64 when upward pressure is inadvertently applied to an end portion 86 of the probe plate 69 while inserting a push-on electrical connector thereto. Probe plate 69 is made from a conductive metal such as No. 314 stainless steel that is, to a reasonable extent, resistant to corrosion caused by the acid solution contained in a wet cell battery. A portion 87 of probe plate 69 extends below the bottom wall 82 of base 64 an appropriate length to enable probe plate 69 to detect the correct level of electrolyte in a wet cell. The portion 86 of probe plate 69 that extends beyond the molded portion of cap insert 65 is used as an electrical connector to connect the sensor probe 63 to transducer 1 through wire 62. Probe plate 69 is prevented from pulling loose due to the 90° bend that is molded into, and made a part thereof, of cap insert 05. Cap insert 65 is prevented from twisting in base 64 due to the penetration of probe plate 69 through slot 68 in the bottom of base 64; thereby withstanding forces applied to probe plate 69 when a mating electrical connector is attached thereto.

Figure 7:
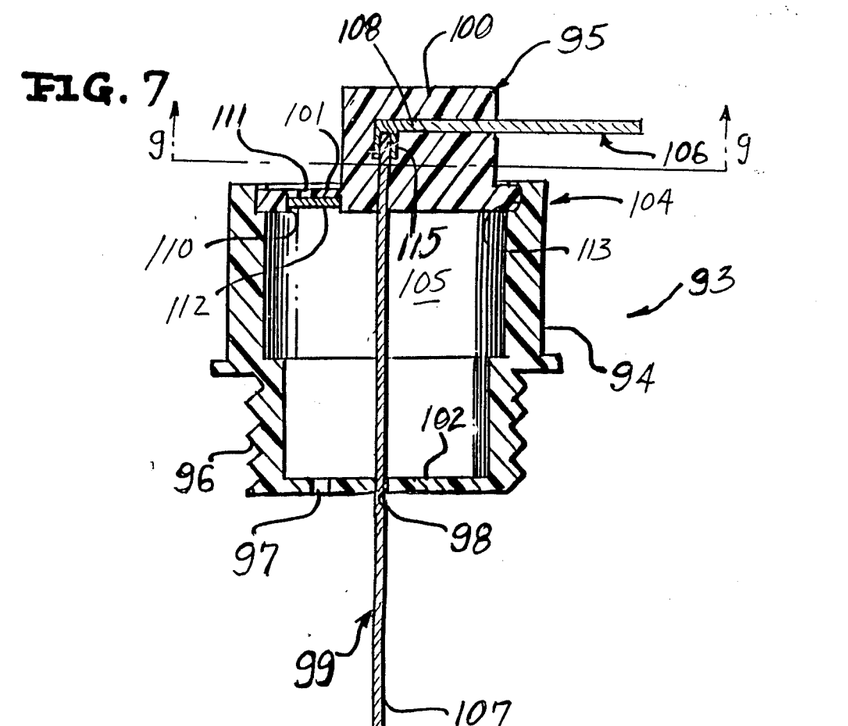
FIG. 7 is a cross-sectional view of another embodiment of the battery cap sensor probe of the invention.
Figure 8:
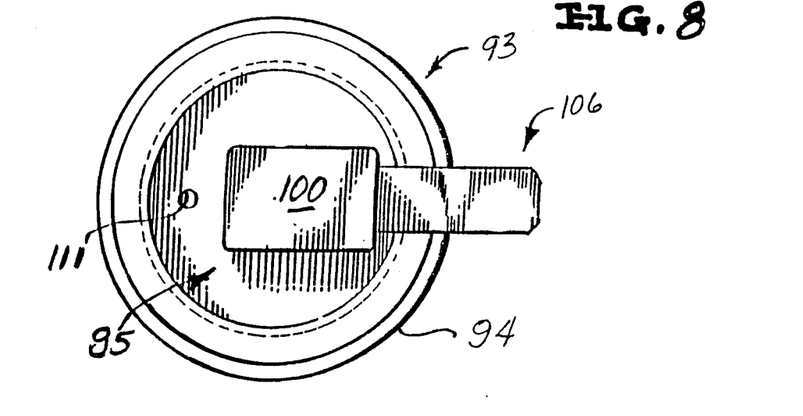
FIG. 8 is a top view of the battery cap sensor probe of FIG. 7.
Figure 9:
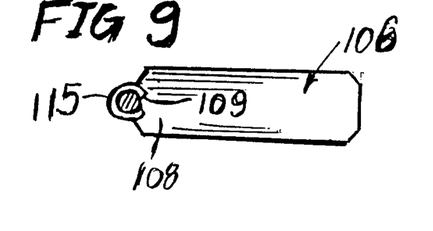
FIG. 9 is a cross-sectional view taken along line 9—9 of FIG. 8 with the plastic cap not shown for clarity.

Reference is now made to FIGS. 7 through 9 of the drawings which illustrates another embodiment of the battery cap sensor probe of the present invention which is generally designated by the reference numeral 93.

The battery cap sensor probe 93 includes a base 94 with a "snap-fit" cap insert 95. The base 94 and the insert 95 are each of a one-piece molding made from a non-corrosive material, such as polypropylene, that will not be affected by direct contact with the acid solution contained within a wet cell, lead acid battery. The base 94 and the insert 95 define a generally hollow body 104 having an interior chamber 105. In this particular embodiment the base 94 is a hollow tubular structure with threads 96 formed in the lower portion, as shown in FIG. 7, to allow the sensor probe 93 to be screwed into a single cell of a wet cell battery having matching threads. The threads 96 may be various sizes to accommodate different thread sizes in various batteries. In a like manner the lower portion of the base 94 may be molded to accommodate either a push-in or a bayonet-type receptacle in various types of batteries. A bottom wall 102 of the base 94 contains a ⅜" vent hole 97 to allow gases that are created inside a wet cell battery to pass through to the interior. Centrally located in a bottom wall 102 of base 94 is a hole 98 measuring approximately 0.140" in diameter to allow a lower extension 107 of the probe 99 to pass through the bottom wall 102. The top of cap insert 95 contains a raised section 100 (FIG. 7) to provide for the integral molding of the probe 99 and its terminal clip 106 into the cap insert 95. The terminal clip 106 and the lower extension 107 define the two pieces of the probe 99. The terminal clip 106 is preferably made from brass measuring 0.250" in width and 0.032" in thickness. The end portion of the terminal clip 106 extending outside the raised section 100 of the cap insert 95 is used as an electrical connector to mate with a standard ¼" female push-on connector. An opposite end of end portion 108 (FIG. 9) of the terminal clip 106 which is located inside the raised section 100 of the cap insert 95 is bent 90° and is formed into a crimpable cylindrical collar 115 having a slit 109. The upper end portion of the lower extension 107 is inserted into the cylindrical collar 115 which is then crimped tightly around the upper end of the extension 107 after which solder is used to additionally join the extension 107 to the collar 115.

Located in the bottom surface of an upper wall 101 of the cap insert 95 is a counterbore 110 that defines a circular depression. A through hole 111 is centrally located in the counterbore 110 and provides an opening from the interior to the exterior of the cap insert 95. Pressed into the counterbore 110 is a porous disk 112 which acts a flame arrestor to allow gases escaping from the wet cell to flow through the vent hole 97 in the bottom wall 102 of the base 94 and upwardly through the opening 111 of the top wall 101. The use of the disk 112 prevents an open flame from entering into the sensor probe 93 while allowing internal gases to escape therefrom.

Located around the internal circumference of the upper portion of base 94 is an inwardly opening peripheral groove 113 extending into the inside wall of the base 94. The outer peripheral edge of the upper wall 101 of the cap insert 95 is molded to a tolerance relative to the counterbore 113 to allow the cap insert 95 to "snap-fit" into the counterbore 113. The bottom edge of the top wall 111 of the cap insert 95 contains an inward 45° bevel to provide a means for introducing the cap insert 95 into the counterbore 113 prior to applying enough pressure to cause the cap insert 95 to "snap-fit" into the counterbore 113.

The extension 107 of the probe 99 is preferably made from a conductive piece of cylindrical material, such as lead formulated with various alloys of other metals, to increase the strength and durability of the probe 99 and, to a reasonable extent, provide resistance to corrosion caused by the acid solution contained in a wet cell battery. It is the upper end of the cylindrical metal piece 107 that is inserted into the collar 115 and crimped thereto and soldered, as described earlier herein. The extension 107 of the probe 99 extends below the bottom wall 102 of the base 94 an appropriate length to enable the extension 107 to detect the correct level of the electrolyte in a wet cell. The terminal clip 106 crimped to the probe 99 that extends beyond the molded portion of the cap insert 95 is used as an electrical connector to connect the sensor probe 93 to the transducer 1 through the wire 62.

The extension 107 and the terminal clip 106 of the probe 99 are prevented from pulling loose because of the crimp connection heretofore described, solder added thereto, and because of the 90° bend of the extension 106 which is, of course, totally encapsulated by the insert molding in the cap insert 95. The cap insert 95 is also prevented from twisting in the base 94 by the application of a hot melt adhesive in the counterbore 113 when the cap insert 95 is inserted into the base 94, thereby withstanding forces applied to the terminal clip 106 when a mating electrical connector is attached thereto.

Although the invention has been described relative to an exemplary embodiment thereof, it will be understood that other variations and modifications can be effected in this embodiment without departing from the scope and the spirit of the invention.

I claim:

1. A battery cap sensor probe comprising a generally hollow body having an interior chamber, means for connecting said body to a battery cell opening, means for placing said interior chamber in fluid communication with a battery cell interior, means for placing said interior chamber in fluid communication with atmosphere whereby said last-mentioned two means allow battery cell gases to escape to atmosphere, a conductive probe carried by said body, said conductive probe being comprised of a probe portion accessible from the exterior of said body and being adapted for immersion into the electrolyte of a battery cell, said conductive probe further including a terminal portion accessible from the exterior of said body and being adapted for electrical connection to an electrical circuit, and means for connecting said probe portion and said terminal portion to each other.

2. The battery cap sensor probe as defined in claim 1 wherein said body is of at least a two-piece construction.

3. The battery cap sensor probe as defined in claim 1 wherein said body is of at least a two-piece construction, and said probe portion and said terminal portion are connected to one of said body pieces.

4. The battery cap sensor probe as defined in claim 1 wherein said body is of at least a two-piece construction, and said connecting means includes a crimp connection between said probe portion and said terminal portion.

5. The battery cap sensor probe as defined in claim 1 wherein said body is of at least a two-piece construction, and means for snap-connecting said body pieces to each other.

6. The battery cap sensor probe as defined in claim wherein said body is of at least a two-piece construction, said terminal portion passes through a wall of one of said body pieces, and means for preventing inadvertent disassembly of said at least two pieces during the connection of said terminal to an electrical circuit.

7. The battery cap sensor probe as defined in claim 1 wherein said probe portion and said terminal portion are insert molded inside said body.

8. The battery cap sensor probe as defined in claim 1 wherein said connecting means is a crimped connection between said terminal portion and said probe portion.

9. The battery sensor probe as defined in claim 1 wherein said connecting means is a solder connection between said terminal portion and said probe portion.

10. The battery cap sensor probe as defined in claim 1 wherein said connecting means is a soldered crimped connection between said terminal portion and said probe portion.

11. The battery sensor probe as defined in claim wherein said connecting means is insert molded inside said body.

12. The battery sensor probe as defined in claim 8 wherein said crimped connection is a tubular portion of said terminal portion within which is telescopically received said probe portion.

13. The battery sensor probe as defined in claim 2 including solder securing said crimped tubular portion to said probe portion.

* * * * *